United States Patent [19]

de Cremoux

[11] 4,024,559

[45] May 17, 1977

[54] ELECTROLUMINESCENT DIODES AND A METHOD OF MANUFACTURING SAME

[75] Inventor: Beaudouin de Cremoux, Paris, France

[73] Assignee: Thomson-CSF, Paris, France

[22] Filed: Jan. 26, 1976

[21] Appl. No.: 652,284

[30] Foreign Application Priority Data

Jan. 31, 1975 France .............................. 75.03102

[52] U.S. Cl. .................................. 357/17; 357/18; 357/16
[51] Int. Cl.² ................. H01L 33/00; H01L 29/161
[58] Field of Search .................... 357/17, 18, 16

[56] References Cited

UNITED STATES PATENTS

| 3,855,607 | 12/1974 | Kressel et al. | 357/18 |
| 3,936,855 | 2/1976 | Goell et al. | 357/17 |

*Primary Examiner*—Martin H. Edlow
*Attorney, Agent, or Firm*—Cushman, Darby & Cushman

[57] ABSTRACT

The present invention relates to a novel electroluminescent diode. Said diode comprises, inserted in one of the elements of the junction, a zone of the same conductivity type as said element and forming a junction with the other element. Said zone has a forbidden bandwidth which is less than those of the two elements, and which, for a given voltage, is the emissive part of the diode. The invention is applicable in particular to fiber optic telecommunications.

5 Claims, 10 Drawing Figures

ELECTROLUMINESCENT DIODES AND A METHOD OF MANUFACTURING SAME

The present invention relates to a novel type of electroluminescent diode and a method of manufacturing same.

Electroluminescent diodes are of major significance in the context of fibre optic telecommunications.

However, they are difficult to utilise because it is necessary for the light-emitting area to be less than or equal to the diameter of the fibre, the order of magnitude of which latter is 50 to 100 microns.

Electroluminescent emitters are known, whose emissive area is constituted by the whole of the free face of the electroluminescent diode. To achieve good coupling, it is therefore necessary to utilise diodes having very small transverse dimensions.

Moreover, part of the emissive zone is masked by the electrical contact through which the appropriate voltage is applied between the two elements of the junction.

Finally, the junction is not protected from the environment, since no passivating treatment is possible.

The object of the present invention is an electroluminescent diode which makes it possible to overcome these drawbacks.

The electroluminescent diode in accordance with the invention is of the kind comprising a junction between two separate conductor materials, the first having p-type majority charge carriers and the other n-type majority charge carriers.

The diode is essentially characterised in that in one of the elements there is inserted a zone of semiconductor material the width of whose forbidden band is substantially narrower than that of the two junction elements, said zone forming a semiconductor junction with the other element.

The invention will be better understood from a consideration of the ensuing description and by reference to the attached drawings in which.

Figure 1:
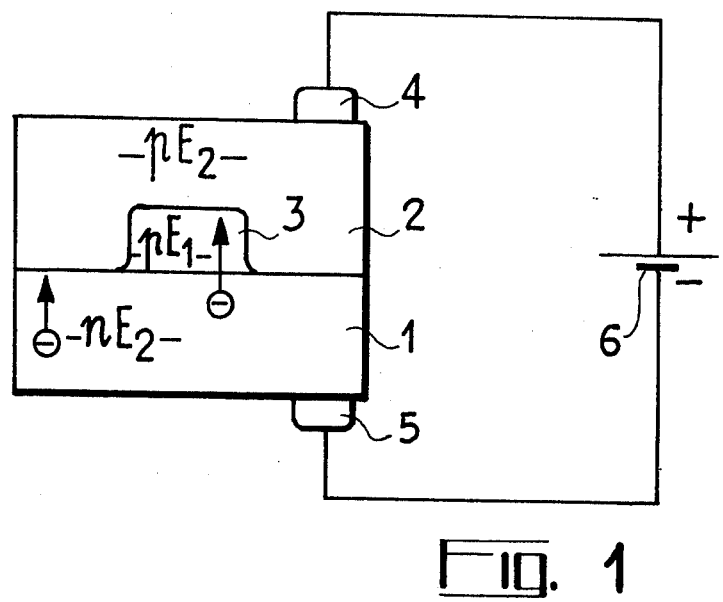
FIG. 1 is a schematic view of an embodiment of the diode in accordance with the invention.

FIG. 1 schematically illustrates an embodiment which makes it possible to understand the principle of the device in accordance with the invention. It comprises an electroluminescent diode constituted by two semiconductor elements 1 and 2 respectively of $n$ and $p$ types, forming a junction. These two elements have been assumed to be made of the same material and consequently have the same forbidden bandwith $E_2$. However, this is by no means an essential pre-requisite.

In the element 2, there is inserted a region 3, likewise of $p$ type material but whose forbidden bandwidth $E_1$ is much narrower. To simplify matters, it will be assumed that the energy levels of the valency bands are the same in all the materials 1, 2 and 3. Two contacts 4 and 5 make it possible to forward-bias the junctions.

Figure 2:
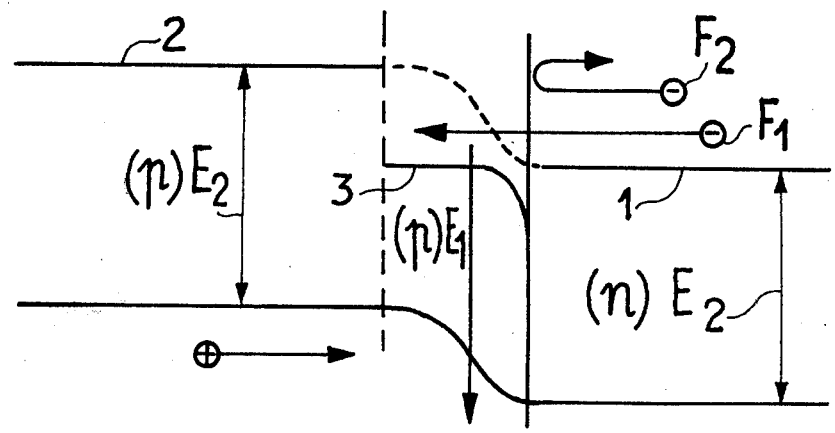
FIG. 2 is an explanatory diagram illustrating the energy levels in a different part of the diode.

The operation of the system will be understood from a consideration of FIG. 2 which illustrates the energy levels characteristic of the different regions.

The full line illustrates the energy levels of the valency bands of the three regions 1, 2 and 3, as well as the energy levels of the conduction bands of the regions 1 and 2 at either side of the junction.

In the neighbourhood of the junction itself, there have been illustrated in broken line the energy levels corresponding to the conduction bands of the elements 1 and 2, and, in full line, the energy level of the conduction band of the region 3. This clearly illustrates the nature of the various potential barriers, corresponding to the two junctions 2 - 1 and 3 - 1.

The width of the forbidden band $E_1$ being narrower than the $E_2$, the top energy level of the conduction band is substantially lower than that of the conduction band of the medium 2.

This results in potential barriers. These barriers are translated, in the energy levels, by the graphs respectively in full line and broken line.

If a voltage is applied across the terminals of the system in order to forward bias it, said voltage being insufficient however, to enable the electrons of zone 1 to clear the potential barrier at the junction 1-2, there will be a range of voltages which enable the electrons of the zone 1 to enter the zone 3, the latter having a forbidden bandwidth which is narrower than those of the two main regions, and this is translated into terms of a reduction in the level of the conduction band in the zone 3. The electrons coming from the element 1, will clear the potential barrier at the junction 1-3.

Since the diode is forward-biased, positive electrical charge carriers will enter the region 3. The result will be neutralization by these charge carriers, of certains of the electrons in the valency bands.

The electrons population in this band will be decreased and free spaces will appear. The electrons arriving in the conduction band of the element 3, will then drop from the conduction band to the valency band in order to occupy the spaces and will produce the phenomenon of electroluminescence (electrons $F_1$ of FIG. 2).

The electrons $F_2$ coming directly from the zone 1 to the zone 2, are blocked by the corresponding potential barrier. Thus, for this potential range, only the region 3 will give rise to light emission.

In the following, a process will be described by which to manufacture electroluminescent diodes of this kind.

Figure 3:
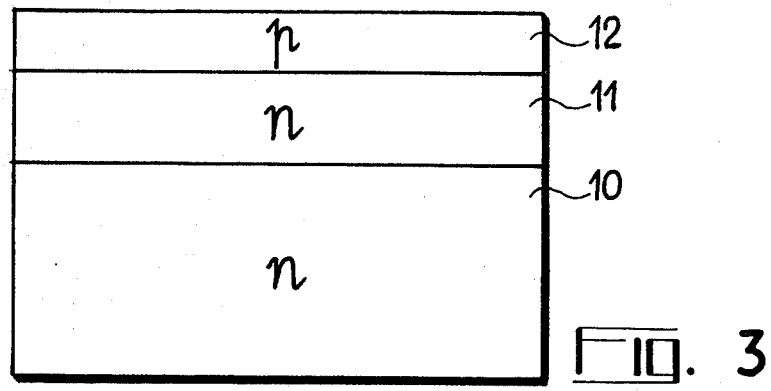
FIGS. 3 to 7 illustrate the diode following the various stages in its manufacture.

FIG. 3 shows, deposited upon a substrate 10 of semiconductor material, n-type silicon-doped gallium arsenide, with a doping concentration of $10^{18}$ at/cm$^3$, the following successive epitaxial layers:

A layer 11 whose chemical composition is $Ga_{1-x}Al_xAs$ where $0.2 < x < 0.4$ and n-type tellurium-doped material having the same doping concentration $10^{18}$ at/cm$^3$ and a thickness of the order of 3 microns;

A layer 12 whose chemical composition is $Ga_{1-y}Al_yAs$ where $0 < y < 0.1$ a p-type silicon-doped or germanium-doped material having a thickness of 1 to 2 microns. In this layer the emissive part of the diode will ultimately be formed.

Figure 4:
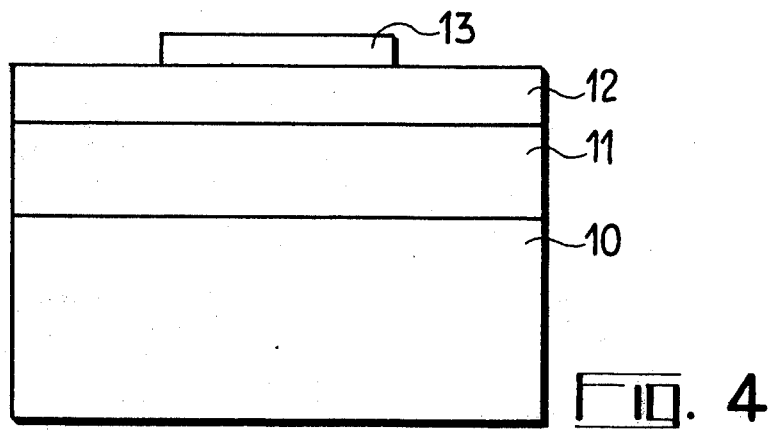

In FIG. 4, there can be seen deposited upon the surface of the system a layer of photosensitive resin which, after exposure through a mask, is maintained at 13 where it protects that portion of the zone 12 which is designed to act as the source of photo emission.

The system is etched either chemically in a solution with an oxygenated water basis, or by ion machining. This operation is controlled in order to leave in the unprotected regions of the layer 13 a thickness of 0.1 to 0.5 microns. This region, by virtue of its lower aluminium content, lends itself particularly well to the ensuing liquid-phase epitaxial operation used in this method of manufacture. By the end of this operation, the system takes the form shown in FIG. 5.

The system is then placed in a bath of gallium arsenide having the composition $Ga_{1-x}Al_xAs$.

The process then takes place in the following manner. The bath is saturated with Ga As at a temperature of 800° C.

It is rendered unsaturated by an increase in temperature from 800° to 800°.5 whereafter the temperature is reduced at a uniform rate of 0.1° C/mn..

Figure 5:
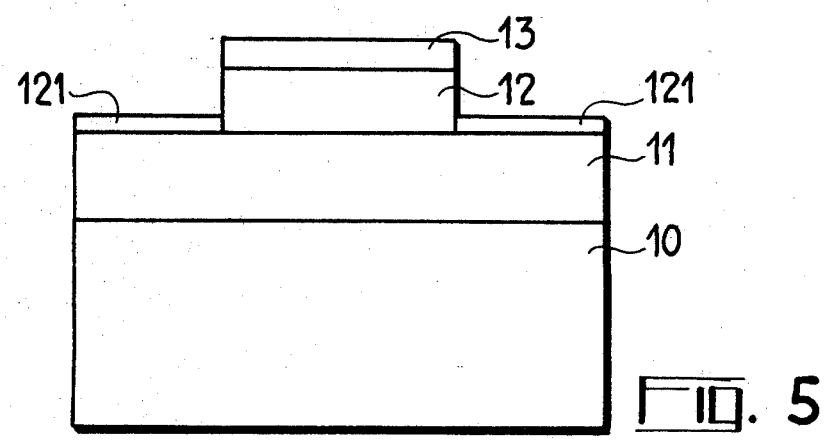
Figure 6:
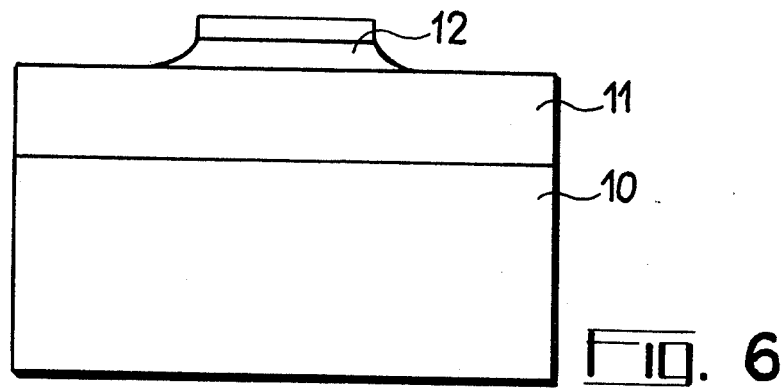

Initially the epitaxial layer 12 is dissolved until the regions 121 of FIG. 5 disappear, and this is followed by epitaxial growth of a new layer 13, shown in FIG. 6, which is p-doped and has a thickness of 2 to 3 microns, covering the system.

Figure 7:
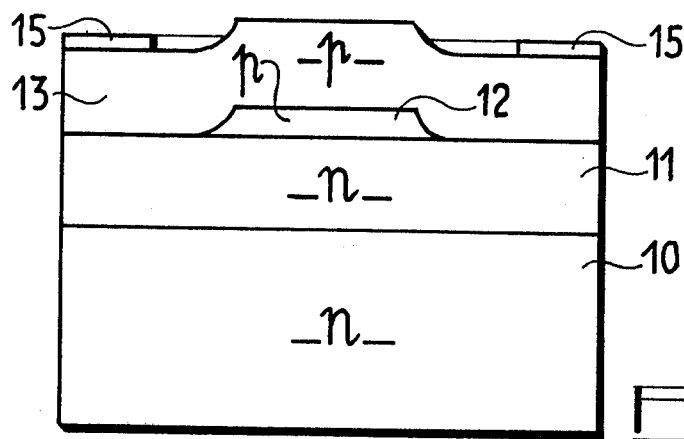

The contacts are then formed in the conventional way (FIG. 7).

In this embodiment, the forbidden band of $Ga_{1-x}Al_x$-$AsE_2$ is of the order of 1.8 e V. That of gallium arsenide is $E_1 = 1,4$ eV. The transverse dimensions are of the order of 500 microns.

Figure 8:
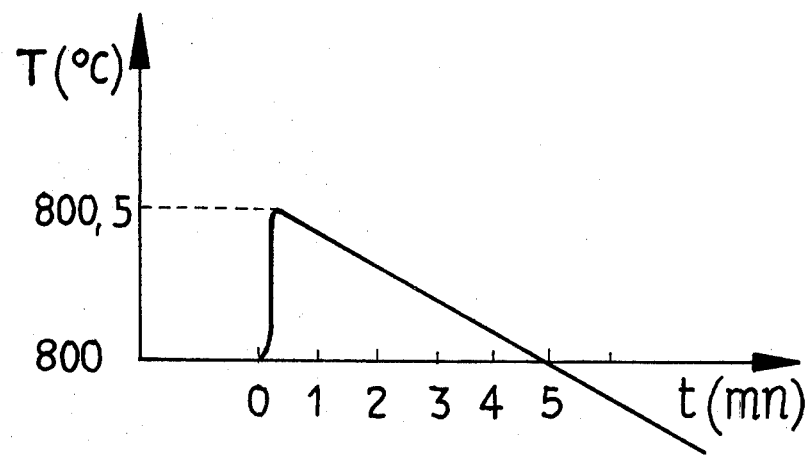
FIGS. 8 and 9 are explanatory diagrams.
Figure 9:
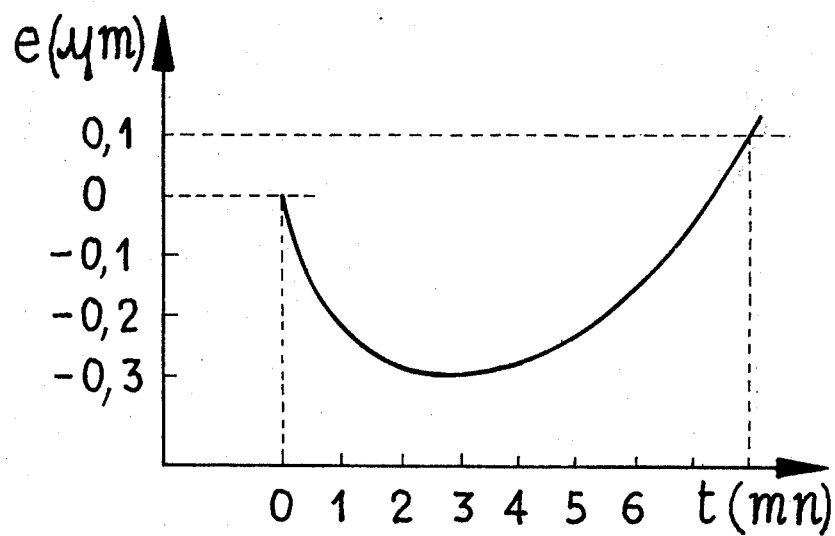

FIGS. 8 and 9 respectively illustrate as a fucntion of time (in minutes) the variations in bath temperature and in the thickness of the epitaxial layer. The negative ordinates correspond to the dissolving of the epitaxial layers.

In FIGS. 8 and 9 it will be seen that the dissolved thickness is not very closely dependent upon the time of transit through the dissolving bath.

The contacts are then deposited by one or other of the known methods. In FIG. 5, the contact 15 is annular and has an opening sufficiently large to mask only the non-emissive zone.

Self-evidently, the applications of these novel diodes are not limited to telecommunications.

Figure 10:
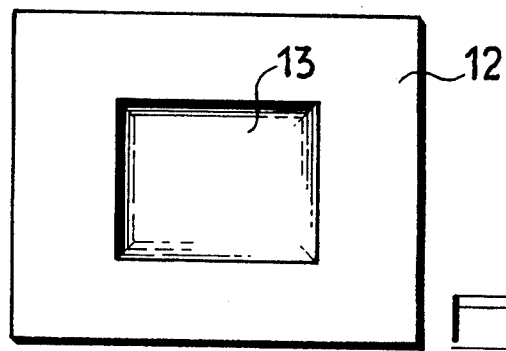
FIG. 10 illustrates an example of an application.

The emissive zones can be given any desired shapes. For example, it is possible to build remote display modules using them. Equally, by varying the applied voltage, it is possible to illuminate the contour of a given figure or the whole of the figure as shown in FIG. 10. The square illustrated has contours made of the region 12 and a centre made of the region 13. For an appropriate voltage range, only the contour of the surface lights up. Beyond this range, the whole system lights up.

What I claim is:

1. An electroluminescent diode comprising a first and a second semiconductor element having respectively a first and a second type of conductivity, said second type being opposite to the first, said elements forming a rectifying junction, said first element having a central zone and a peripheral zone, a semiconductor zone being inserted in said central zone having said first type of conductivity, said semiconductor zone being made of a material having a band gap, narrower than those of said first and second elements, and terminal contact means over surfaces of said first and second elements to supply a voltage such that only said semiconductor zone is capable of emitting light rays.

2. A diode as claimed in claim 1, wherein said two elements are made on same first material.

3. A diode as claimed in claim 2, wherein said first material has the chemical formula $Ga_{1-x}Al_xAs$ where $0.2 < x < 0.4$ 4. A diode as claimed in claim 3, wherein said zone is made of a second material having the chemical formula $Ga_{1-y}Al_yA_s$ where $0 \leq y < 0.1$.

5. A diode as claimed in claim 4, wherein the two elements have a doping concentration of the order of $10^{18}$ at/cm$^3$.

* * * * *